United States Patent [19]

Sandhu

[11] 4,132,833

[45] Jan. 2, 1979

[54] DYE ELEMENT WITH A TRANSPARENT POLYESTER LAYER CONTAINING HEAT-TRANSFERABLE DYES

[75] Inventor: M. Akram Sandhu, Webster, N.Y.

[73] Assignee: Eastman Kodak Company, Rochester, N.Y.

[21] Appl. No.: 842,837

[22] Filed: Oct. 17, 1977

Related U.S. Application Data

[63] Continuation of Ser. No. 730,884, Oct. 8, 1976, Pat. No. 4,097,230.

[51] Int. Cl.$^2$ .......................... B32B 27/10; G03F 7/00

[52] U.S. Cl. .................................... 428/481; 428/458; 428/480; 428/430; 428/442; 428/412; 96/36.3; 101/470; 101/473; 260/40 R; 260/37 PC

[58] Field of Search ............... 428/458, 480, 481, 430, 428/442, 412, 488; 96/36.3; 260/41, 41.5; 101/470, 473

[56] References Cited

U.S. PATENT DOCUMENTS

| | | | |
|---|---|---|---|
| 3,317,466 | 5/1967 | Caldwell et al. | 260/47 |
| 3,508,492 | 4/1970 | Seibert et al. | 101/470 |
| 3,632,291 | 1/1972 | Rieben et al. | 8/2.5 |
| 3,707,346 | 12/1972 | Markert et al. | 8/2.5 |
| 3,829,286 | 8/1974 | Anzal et al. | 8/2.5 |
| 3,940,246 | 2/1976 | DeFago et al. | 8/2.5 A |

FOREIGN PATENT DOCUMENTS

| | | | |
|---|---|---|---|
| 860888 | 1/1971 | Canada. | |
| 954301 | 9/1974 | Canada. | |
| 2500316 | 7/1975 | Fed. Rep. of Germany. | |
| 1154162 | 6/1969 | United Kingdom | 96/29 |
| 1275067 | 5/1972 | United Kingdom | 101/149.1 |
| 1278325 | 6/1972 | United Kingdom | 96/17 |
| 1281859 | 7/1972 | United Kingdom | 101/149.1 |
| 1381225 | 1/1975 | United Kingdom. | |

*Primary Examiner*—P. C. Ives
*Attorney, Agent, or Firm*—J. J. Hawley

[57] ABSTRACT

A dye receiving element comprises diffusing heat transferable dyes into a transparent layer containing an amorphous, solvent soluble, aromatic polyester having at least 30 mole percent of its recurring units comprised of the condensation residue of a diol and a dicarboxylic acid, the residue containing a saturated gem-bivalent radical having a saturated polycyclic three-dimensional structure that includes a saturated bicyclic atomic bridged hydrocarbon ring member, the gem-bivalent radical linking two aromatic groups.

18 Claims, 6 Drawing Figures

DYE ELEMENT WITH A TRANSPARENT POLYESTER LAYER CONTAINING HEAT-TRANSFERABLE DYES

This is a continuation, of application Ser. No. 730,884, filed Oct. 8, 1976 now U.S. Pat. No. 4,097,230.

FIELD OF THE INVENTION

This invention is related to methods and materials for the heat transfer of dyes and particularly to a method for the heat transfer of dyes employing a dye receiving element comprising a layer having a polyester composition.

DESCRIPTION OF THE PRIOR ART

Heat transfer printing is a process for transferring dyestuffs to a receiving substrate by vaporization and diffusion from printed intermediate or auxiliary carriers, primarily paper webs. This process is widely used for printing patterns on textile materials although other uses, such as in making colored prints as described in, for example, U.S. Pat. No. 3,508,492, and British Pat. Nos. 1,275,067; 1,278,325; 1,281,859; 1,154,162; and 1,381,225 have been made. In these processes, especially transfer printing to textiles, a wide variety of receiving substrates have been used including such synthetic polymers as polyacrylonitrile; polymers of other vinyl compounds such as acrylic esters, acrylic amides, vinyl pyridine, vinyl chloride, vinylidene chloride, etc.; copolymers of dicyanoethylene and vinyl acetate; polyurethane; polyolefins; cellulose acetates; polyamides; and aromatic polyesters such as those from terephthalic acid and ethylene glycol or 1,4-di(hydroxymethyl)cyclohexane.

Heat transfer processes and materials useful in such processes are described in, for example, U.S. Pat. Nos. 3,508,492; 3,632,291; 3,707,346; 3,829,286; and 3,940,246; British Pat. Nos. 1,275,067; 1,278,325; 1,281,859; 1,154,162; and 1,381,225; Canadian Pat. Nos. 954,301; and 860,888; and in German Pat. No. 2,500,316.

The heat transfer process is generally accomplished by heating the dye receiving substrate to a temperature above its glass transition temperature ($T_g$) and at which the dye has sufficient vapor pressure to diffuse from the carrier into the substrate. For commonly used materials, generally, if a temperature below the $T_g$ of the substrate is used, either the dye will not have sufficient vapor pressure or the rate of diffusion into the substrate is too low to be practical.

SUMMARY OF THE INVENTION

The present invention provides an improved method for transferring heat transferable dyes employing improved dye receiving elements. Dye receiving elements useful in this invention comprise a transparent layer comprising an amorphous, solvent soluble, aromatic polyester having at least 30 mole percent of its recurring units comprised of the condensation residue of aromatic diol having the general formula:

$$HO—AR—X—AR—OH \quad I$$

or the condensation residue of aromatic dicarboxylic acid having the general formula:

$$HOOC—AR—X—AR—COOH \quad II$$

wherein AR is an aromatic radical and X is a saturated gembivalent radical having a saturated polycyclic three-dimensional structure that includes a saturated bicyclic atomic bridged hydrocarbon ring member.

When transferring dyes in accordance with the present invention the dyes tend to maintain a sharp boundary between dyed areas and undyed areas of the receiving element as the dyes diffuse into the element. Therefore, extraordinarily sharp images can be obtained using the heat transfer method of this invention.

The dye receiving elements of this invention allow relatively high rates of diffusion by heat transferable dyes even when such elements are used at temperatures below the $T_g$ of the polyesters described above. Thus the dye receiving elements of this invention are particularly useful in applications where dimensional stability of the substrate is important. In addition, the relatively high $T_g$'s of the polyesters useful in the dye receiving elements of this invention enable one to use a broader range of dyestuffs in the heat transfer process.

BRIEF DESCRIPTION OF THE FIGURES

FIG. 1(*b*) is a photomicrograph of a cross-section of a dye receiving element having a heat relaxed Estar dye receiving layer taken at 2500× magnification into which the same red dye as used in FIG. 1(*a*) was transferred by diffusion from a carrier sheet at 200° C. for 30 seconds.

FIG. 2(*b*) is a photomicrograph of a cross-section of a dye receiving element having a heat relaxed Estar dye receiving layer taken at 2500× magnification into which the same blue dye as used in FIG. 2(*a*) was transferred by diffusion from a carrier sheet at 180° C. for 30 seconds.

FIG. 3(*b*) is a photomicrograph of a cross-section of a dye receiving element having a heat relaxed Estar dye receiving layer taken at 2500× magnification into which the same green dye as used in FIG. 3(*a*) was transferred by diffusion from a carrier sheet at 180° C. for 30 seconds.

DETAILED DESCRIPTION OF THE INVENTION

Figure 1A:
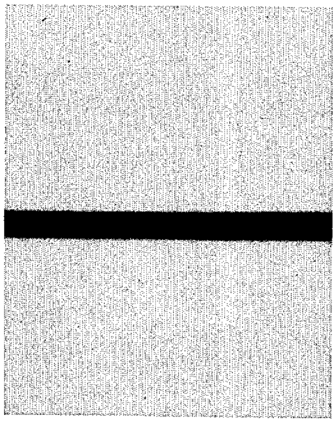
FIG. 1(*a*) is a photomicrograph of a cross-section of a dye receiving element of the present invention taken at 2500× magnification into which a red dye was transferred by diffusion from a carrier sheet at 200° C. for 30 seconds.

In accord with the present invention a method for the transfer of heat transferable dyes employs dye receiving elements comprising a particular class of aromatic polyesters that are comprised of condensation residues of diols and carbonic acid or dicarboxylic acids wherein either the diols or dicarboxylic acids contain a saturated gem-bivalent linking radical having a saturated polycyclic structure that includes a bicyclic member containing at least one atomic bridge.

Typical of some three-dimensional polycyclic structures that provide a gem-bivalent radical is the norbornane ring. The conventional method of drawing this ring is as follows:

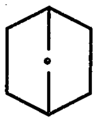

An approximate representation which shows the three-dimensional nature of the ring is as follows:

Within the gem-bivalent connecting radical, the single carbon atom to which, for example, the two phenol nuclei of an aromatic diol or dicarboxylic acid are connected may be a carbon within the polycyclic structure, or it may be a

group attached to the polycyclic structure. For example, in 4,4'-(2-norbornylidene)diphenol, the phenolic groups are attached directly to a carbon atom within the polycyclic structure:

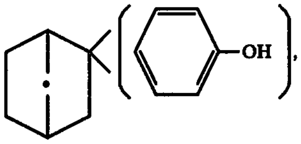

In 4,4'-(2-norbornylmethylene)diphenol, a methylidyne group attached to the polycyclic structure carries the phenolic groups:

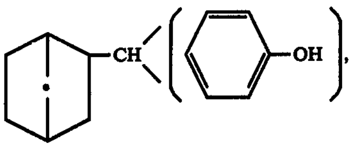

There may be additional saturated rings in the polycyclic structure in addition to the bicyclic member which contains the atomic bridge. These may be joined by fused or spiro-union linkage in the polycyclic structure. Atomic bridges may also occur in the additional member rings of the polycyclic structure. There may be alkyl, halogen, or aromatic substituents in the linking radical.

The atomic bridge within the polycyclic structure may have more than one carbon atom, e.g., (bicyclo[2.2.2]-octane)

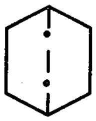

There may be more than one bridge in the polycyclic structure: e.g. (tricyclo[2.2.1.$0^{2,6}$]heptane)

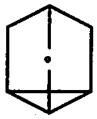

(adamantane)

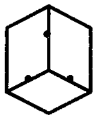

The atomic bridge may consist of an oxygen or nitrogen atom instead of carbon: e.g. (7-oxabicyclo[2.2.1]-heptane)

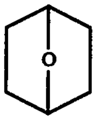

There may be alkyl, aryl and halide substituents on the polycyclic structure: e.g. (substituted norbornane)

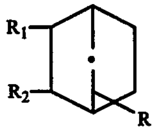

R, $R_1$ and $R_2$ = H, halogen, alkyl ($C_1$–$C_4$), and aryl. Also, two substituents may be attached to the same carbon atom. Of course all of these substituents must be in positions which do not interfere with formation of the diol or dicarboxylic acid. For example, because of steric effects, certain bisphenols cannot be obtained, e.g., those from some norbornane derivatives with two alkyl or halogen substituents in the 3 or 7 positions.

Additional saturated rings may be fused to the bicyclic bridged ring member in the polycyclic structure. These may be hydrocarbon or heterocyclic rings, e.g., (hexahydro-4,7-methanoindane)

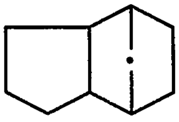

(octahydro-4,7-methanoisobenzofurane)

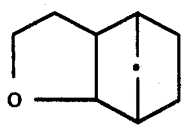

There may be additional bridges in the fused rings, e.g., (decahydro-1,4,5,8-dimethanonaphthalene)

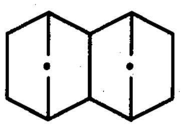

(dodecahydro-4,9,5,8-dimethano-1-cyclopenta(b)naphthalene)

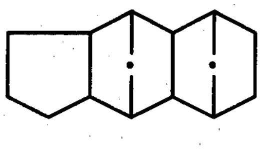

Additional saturated rings may be joined in the polycyclic structure by spiro-union linkage, e.g. (spiro[cyclopropane-1,7'-norbornane])

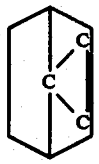

Any aromatic radical can be used in the diols and dicarboxylic acids described by the generic formula I or II above as long as they do not cause steric interference with their formation. Thus both substituted and unsubstituted aromatic radicals are useful. A particularly useful aromatic radical is the phenyl radical which preferably has one of the following formulas:

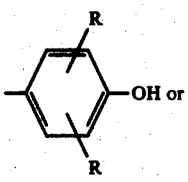 or 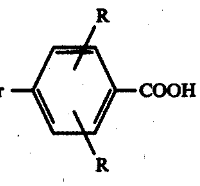

wherein each R is selected independently from hydrogen, halogen, or alkyl groups, preferably having from 1 to about 4 carbon atoms. Additional saturated or unsaturated rings may be fused to the benzene ring and the functional hydroxy or carboxy group can be attached at any convenient position. Preferably both R groups are substituted in positions ortho to the hydroxy or carboxy group on the benzene ring. The preparation of certain bisphenols useful in the practice of the present invention is described in U.S. Pat. No. 3,317,466 issued May 2, 1967 to Caldwell et al. which is incorporated herein by reference.

According to the invention at least 30 mole percent, and preferably at least 45 mole percent, of the linear condensation polymer is composed of residues having an aromatic diol or dicarboxylic acid containing a gem-bivalent connecting radical having a saturated, bridged, polycyclic ring structure.

In a preferred embodiment of the invention, the remaining recurring units are derived from diol that comprises a bisphenol having the following structure:

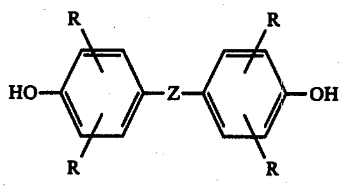

wherein R is the same as defined above and Z is selected from a sulfonyl group; an alkylidene group, preferably isopropylidene; or a cycloalkylidene group such as, for example, cyclopentylidene, cyclohexylidene, 2-norbornylidene, 9-fluorenylidene, 2(5H)-benzo[c]furanon-5-ylidene, and the like preferably the R groups are each located in positions ortho to the hydroxy group on the benzene rings.

In another preferred embodiment, when the diol comprises an aromatic group containing the gem-bivalent linking radical as described above, at least about 30 mole percent of the dicarboxylic acid component is terephthalic acid, isophthalic acid, or a mixture thereof. The remainder of the acid component, up to 70 mole percent, can be selected from carbonic acid or from other dicarboxylic acids. Such dicarboxylic acids can preferably include, for example, 4,4,'-sulfonylbisbenzoate; 1,2,3,4-tetrahydro-2,6-naphthalenedicarboxylate; 4,4'-isopropylidenebisbenzoate; 2,6-naphthalenedicarboxylate; and 1,1,3-trimethyl-3-phenylindan-5,4'-dicarboxylate.

Particularly useful polyesters include, for example, poly[4,4'-isopropylidenediphenylene-co-4,4'-hexahydro-4,7-methanoindan-5-ylidenediphenylene (50:50 molar ratio) terephthalateco-isophthalate (50:50 molar ratio)], poly(4,4'-hexahydro-4,7-methanoindan-5-ylidenediphenylene terephthalate), poly[4,4'-(2-norbornylidene)diphenylene carbonate], and poly(4,4'-hexahydro-4,7-methanoindan-5-ylidenediphenylene carbonate).

Polyesters useful as dye receiving layers in the practice of the present invention are transparent, substantially amorphous, solvent soluble polyesters as described above. Generally these polyesters have a relatively high $T_g$, i.e., a $T_g$ greater than about 200° C. Dye receiving elements of this invention can be made by coating a substrate from a solvent solution of the polyester or by casting a film of the polyester from such solution. Solvents for the polyesters include, for example, methylene chloride, chloroform, tetrachloroethane, phenol/tetrachloroethane (60/40), and the like. When it is desired to coat the polyester on a substrate, any suitable material can be used. Typical examples of useful substrates include glass, paper, metals including foils, photographic film base, and the like.

The dye receiving elements of the present invention can be used for heat transfer of various classes of dyes including, for example, azo, anthraquinone, indophenol, indoaniline, perinone, quinophthalone, acridine, xanthone, diazine, and oxazine dyes.

The surprising results obtained when heat transferring a dye into the dye receiving elements of the present invention can be easily seen by referring to the Figures.

Figure 1B:
Figure 2A:
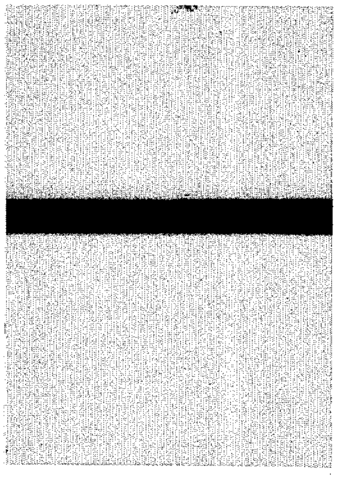
FIG. 2(*a*) is a photomicrograph of a cross-section of a dye receiving element of the present invention taken at 2500× magnification into which a blue dye was transferred by diffusion from a carrier sheet at 180° C. for 30 seconds.
Figure 2B:
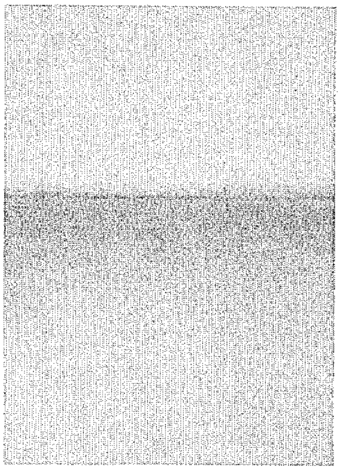
Figure 3A:
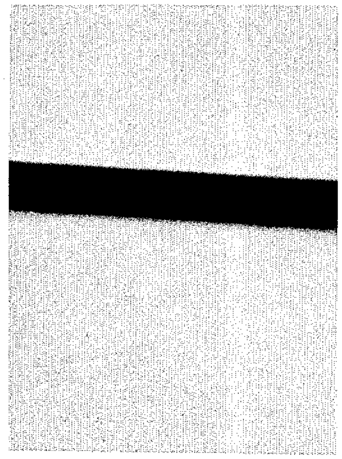
FIG. 3(*a*) is a photomicrograph of a cross-section of a dye receiving element of the present invention taken at 2500× magnification into which a green dye was transferred by diffusion from a carrier sheet at 180° C. for 30 seconds.
Figure 3B:
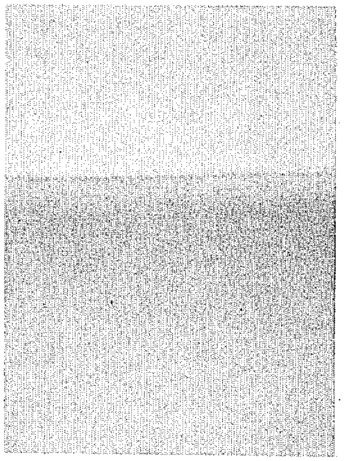

A series of red, green, and blue dyes were transferred into (1) a dye receiving element comprising a layer of poly(4,4'-hexahydro-4,7-methanoindan-5-ylidenediphenylene terephthalate), an element in accord with the present invention with the polyester having a $T_g$ = 320°0 C., and into (2) a dye receiving element the same as above except comprising a layer of heat-released poly(ethylene terephthalate) having a $T_g$ = 120° C. The green dye, a mixture of Eastone Yellow R-GFD and Eastman Blue GBN (both available from the Eastman Kodak Co., Rochester, N.Y.), and blue dye, Eastman Polyester Blue 4RL (also available from the Eastman Kodak Co.), were transferred to both elements at 180° C. for 30 seconds. The red dye, Eastman Red 901 (also available from the Eastman Kodak Co.), was transferred to both elements at 200° C. for 30 seconds. The results of the transfer are shown in the photomicrographs of FIGS. 1, 2 and 3. FIGS. 1(*a*), 2(*a*) and 3(*a*) show the result when using the dye receiving element in accord with the teachings of the present invention. FIGS. 1(*b*), 2(*b*) and 3(*b*) show the results when using a dye receiving element having a layer comprising a conventional polyester.

It is noted that in the pictures of the elements in accord with the present invention that the dyed area of the polyester maintains a definite boundary with the undyed area as the dye diffuses into the polyester. However, in the element having a conventional polyester no such boundary exists. The dye has diffused more widely through the conventional polyester.

Although the invention has been described in considerable detail with reference to certain preferred embodiments thereof, it will be understood that variations and modifications can be effected by those skilled in the art without departing from the spirit and scope of the invention.

What is claimed is:

1. A dyed element comprising a substrate having thereon a transparent layer containing an amorphous, solvent soluble, aromatic polyester comprising at least 30 mole percent of its recurring units comprised of the condensation residue of aromatic diol having the general formula:

HO—AR—X—AR—OH or the condensation residue of aromatic dicarboxylic acid having the general formula:

HOOC—AR—X—AR—COOH wherein AR is an aromatic radical and X is a saturated gembivalent radical having a saturated polycyclic three-dimensional structure that includes a saturated bicyclic atomic bridged hydrocarbon ring member, said layer containing therein a heat-transferable dye.

2. The dyed element as described in claim 1 wherein said substrate is paper or photographic film base.

3. A dyed element comprising a substrate having thereon a layer having a transparent, amorphous, solvent soluble, aromatic polyester comprising at least 30 mole percent of its recurring units comprised of the condensation residue of carbonic acid or dicarboxylic acid with bisphenol having the general formula:

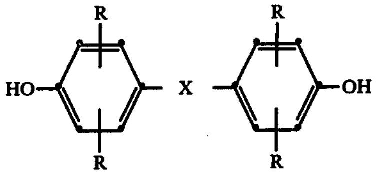

where R is hydrogen, halogen, or an alkyl group having from 1 to about 4 carbon atoms, and X represents a saturated gem-bivalent radical having a saturated polycyclic three-dimensional structure that includes a saturated bicyclic atomic bridged hydrocarbon ring member, said layer containing therein a heat-transferable dye.

4. The dyed element as described in claim 3 wherein the remaining recurring units of said polyester are comprised of the condensation residue of diol having the general formula:

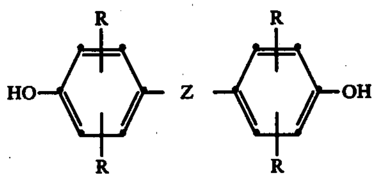

wherein R is hydrogen, halogen, or an alkyl group having from 1 to about 4 carbon atoms, and Z is a sulfonyl group, an alkylidene group, or a cycloalkylidene group.

5. The dyed element as described in claim 4 wherein at least 30 mole percent of said dicarboxylic acid is terephthalic acid, isophthalic acid, or a mixture thereof.

6. The dyed element as described in claim 3 wherein at least 45 mole percent of the recurring units of said polyester are the condensation residue of said dicarboxylic acid and said bisphenol.

7. The dyed element as described in claim 3 wherein said substrate is paper or photographic film base.

8. A dyed element comprising a substrate having thereon a layer having a transparent, amorphous, solvent soluble, aromatic polyester comprising recurring units comprising the condensation residue of diol with carbonic acid or dicarboxylic acid, at least 30 mole percent of the diol being comprised of bisphenol having the general formula:

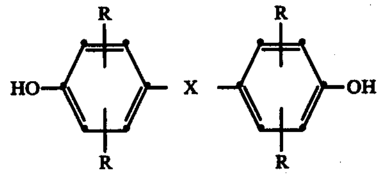

wherein R is hydrogen, halogen, or an alkyl group having from 1 to about 4 carbon atoms, and X is a saturated gembivalent radical having a saturated polycyclic three-dimensional structure that includes a saturated bicyclic atomic bridged hydrocarbon ring member; and at least 30 mole percent of said dicarboxylic acid being comprised of terephthalic acid, isophthalic acid, or a mixture thereof, said layer containing therein a heat-transferable dye.

9. The dyed element as described in claim 8 wherein the remaining recurring units of said polyester are the condensation residue of a diol having the general formula:

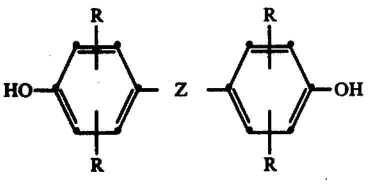

wherein R is hydrogen, halogen, or an alkyl group having from 1 to about 4 carbon atoms, and Z is a sulfonyl group, an alkylidene group, or a cycloalkylidene group.

10. The dyed element as described in claim 8 wherein the remainder of said dicarboxylic acid is selected from the group consisting of 4,4'-sulfonylbisbenzoate; 1,2,3,4-tetrahydro-2,6-naphthalidenedicarboxylate; 4,4'-isopropylidenebisbenzoate; 2,6-naphthalenedicarboxylate; or 1,1,3-trimethyl-3-phenylindan-5,4'-dicarboxylate.

11. The dyed element as described in claim 10 wherein the remainder of said diol is selected from diol having the general formula:

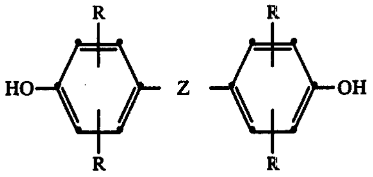

wherein R is hydrogen, halogen, or an alkyl group having from 1 to about 4 carbon atoms, and Z is selected from a sulfonyl group, an isopropylidene group, cyclopentylidene, cyclohexylidene, 2-norbornylidene, 9-fluorenylidene, or 2(5H)-benzo[c]-furanon-5-ylidene.

12. The dyed element as described in claim 8 wherein at least 45 mole percent of the diol is comprised of said bisphenol.

13. The dyed element as described in claim 8 wherein said polyester has a $T_g$ greater than about 200° C.

14. The dyed element as described in claim 23 wherein said substrate is paper or photographic film base.

15. A dyed element comprising a substrate having thereon a layer comprising poly[4,4'-isopropylidenediphenyleneco-4,4'-hexahydro-4,7-methanoindan-5-ylidenediphenyl (50:50 molar ratio) terephthalate-co-isophthalate (50:50 molar ratio)], said layer containing therein a heat-transferable dye.

16. A dyed element comprising a substrate having thereon a layer comprising poly(4,4'-hexahydro-4,7-methanoindan-5-ylidenediphenylene terephthalate), said layer containing therein a heat-transferable dye.

17. A dyed element comprising a substrate having thereon a layer comprising poly[4,4'-(2-norbornylidene)diphenylene carbonate], said layer containing therein a heat-transferable dye.

18. A dyed element comprising a substrate having thereon a layer comprising poly(4,4'-hexahydro-4,7-methanoindan-5-ylidenediphenylene carbonate), said layer containing therein a heat-transferable dye.

* * * * *